(12) United States Patent
Futter et al.

(10) Patent No.: US 8,704,427 B2
(45) Date of Patent: Apr. 22, 2014

(54) MOVEMENT SENSOR

(75) Inventors: Paul Futter, Cary, NC (US); Gunnar Klinghult, Lund (SE)

(73) Assignees: Sony Corporation, Tokyo (JP); Sony Mobile Communications AB, Lund (SE)

( * ) Notice: Subject to any disclaimer, the term of this patent is extended or adjusted under 35 U.S.C. 154(b) by 1001 days.

(21) Appl. No.: 12/765,908

(22) Filed: Apr. 23, 2010

(65) Prior Publication Data

US 2011/0241758 A1    Oct. 6, 2011

Related U.S. Application Data

(60) Provisional application No. 61/320,342, filed on Apr. 2, 2010.

(51) Int. Cl.
*H01L 41/08* (2006.01)

(52) U.S. Cl.
USPC .......................................... 310/339; 310/800

(58) Field of Classification Search
USPC ................................. 310/328, 800
See application file for complete search history.

(56) References Cited

U.S. PATENT DOCUMENTS

| | | | |
|---|---|---|---|
| 5,793,311 A | 8/1998 | Wood | |
| 5,833,713 A | 11/1998 | Moberg | |
| 6,809,462 B2 * | 10/2004 | Pelrine et al. | 310/319 |
| 7,924,143 B2 * | 4/2011 | Griffin et al. | 340/407.2 |
| 8,364,229 B2 * | 1/2013 | Simpson et al. | 600/345 |
| 2004/0237676 A1 | 12/2004 | McKevitt et al. | |
| 2007/0286556 A1 | 12/2007 | Kassamakov et al. | |

OTHER PUBLICATIONS

International Search Report and Written Opinion dated Sep. 9, 2011 issued in corresponding PCT application No. PCT/IB2011/050957, 12 pages.

* cited by examiner

*Primary Examiner* — Mark Budd
(74) *Attorney, Agent, or Firm* — Snyder, Clark, Lesch & Chung, LLP

(57) ABSTRACT

A device may include a component including an electroactive polymer (EAP) material configured to generate a voltage in response to movement of the component. The device may also include voltage detector coupled to the component, the voltage detector configured to detect voltage generated by the component. The device may further include processing logic configured to perform a function based on the detected voltage.

19 Claims, 5 Drawing Sheets

100

MOVEMENT SENSOR

RELATED APPLICATION

This application claims priority under 35 U.S.C. §119 based on U.S. Provisional Application No. 61/320,342, filed Apr. 2, 2010, the disclosure of which is hereby incorporated herein by reference.

TECHNICAL FIELD OF THE INVENTION

The invention relates generally to sensors and, more particularly, to sensors that use electroactive polymers.

DESCRIPTION OF RELATED ART

Electronic devices, such as communication devices, lap top computers, game playing devices, music playing devices, etc., have become increasingly complex, as well as very small in size. As a result, fitting all the necessary electronics and other components into such devices has become more difficult. Another drawback associated with the increasing complexity of such electronic devices is that some components may interfere with the operation of other components. This may cause various components/functionality to be unreliable.

SUMMARY

According to a first aspect, a device may comprise a component including an electroactive polymer (EAP) material configured to generate a voltage in response to movement of the component. The device may also include a voltage detector coupled to the component, the voltage detector configured to detect voltage generated by the component. The device may further include processing logic configured to perform a function based on the detected voltage.

Additionally, the device may comprise a hinge coupling an upper portion of the device to a lower portion of the device, wherein at least a portion of the component is disposed in the hinge. The component may comprise a flexible strip that is configured to bend or un-bend when the device is opened, and the processing logic may be further configured to determine that the device is open based on the detected voltage.

Additionally, the EAP material may comprise an ionic EAP material.

Additionally, the voltage detector may be configured to forward information corresponding to the detected voltage to the processing logic.

Additionally, when performing a function, the processing logic may be configured to at least one of activate a backlight, activate a keypad, activate a button, activate camera functionality or register an input.

Additionally, when generating a voltage, the component may be configured to generate a voltage based on an amount of movement, wherein a larger amount of movement generates a greater voltage as compared to a smaller amount of movement.

Additionally, the component may be configured to generate a first voltage in response to a first movement, and generate a second voltage in response to a second movement. The processing logic may also be configured to receive information corresponding to the first and second voltages, perform a first function in response to the first voltage, and perform a second function in response to the second voltage.

Additionally, the processing logic may be configured to determine a state of the device based on the generated voltage and the EAP material may comprise Nafion.

Additionally, the device may comprise a mobile terminal.

According to another aspect, a method is provided. The method includes generating, in a device, a voltage in response to movement of a flexible component comprising an EAP material. The method also includes detecting the generated voltage, and performing, by the device, a function based on the detected voltage.

Additionally, the method may further comprise determining whether the device is open based on the detected voltage and at least one of activating a backlight or a keypad based on the determining that the device is open.

Additionally, the performing a function may comprise at least one of activating a backlight, activating a keypad, activating a button, activating camera functionality or registering an input.

Additionally, the generating a voltage may comprise generating a voltage based on an amount of movement of the flexible component, wherein a larger amount of movement generates a greater voltage as compared to a smaller amount of movement.

Additionally, the generating a voltage may further comprise generating a first voltage in response to a first movement of the flexible component, and generating a second voltage in response to a second movement of the flexible component. The method may further comprise performing a first function in response to the first voltage, and performing a second function in response to the second voltage.

According to still another aspect, a device comprises an EAP material configured to generate a voltage in response to movement of the EAP material. The device also includes a voltage detector coupled to the EAP material via electrodes, the voltage detector configured to detect voltage generated by the EAP material. The device further includes a processor configured to perform a function based on the detected voltage.

Additionally, the device may comprise a hinge coupling an upper portion of the device to a lower portion of the device, wherein at least a portion of the EAP material is disposed in the hinge within a flexible strip. The processor may be further configured to determine whether the device is open based on the detected voltage.

Additionally, when generating a voltage, the EAP material may be configured to generate a voltage based on an amount of movement of the EAP material. The processor may also be configured to increase the powering of a backlight for the device as the voltage generated by the movement of the EAP material increases.

Additionally, when performing a function, the processor may be configured to at least one of activate a backlight, activate a keypad, activate a button, activate camera functionality or register an input.

Additionally, the component may be configured to generate a first voltage in response to a first movement of the EAP material, and generate a second voltage in response to a second movement of the EAP material. The processor may be further configured to receive information corresponding to the first and second voltages, perform a first function in response to the first voltage, and perform a second function in response to the second voltage.

Additionally, the device may comprise a mobile device.

BRIEF DESCRIPTION OF THE DRAWINGS

Reference is made to the attached drawings, wherein elements having the same reference number designation may represent like elements throughout.

DETAILED DESCRIPTION

The following detailed description of the invention refers to the accompanying drawings. The same reference numbers in different drawings identify the same or similar elements. Also, the following detailed description does not limit the invention. Instead, the scope of the invention is defined by the appended claims and equivalents.

Exemplary System

Figure 1:
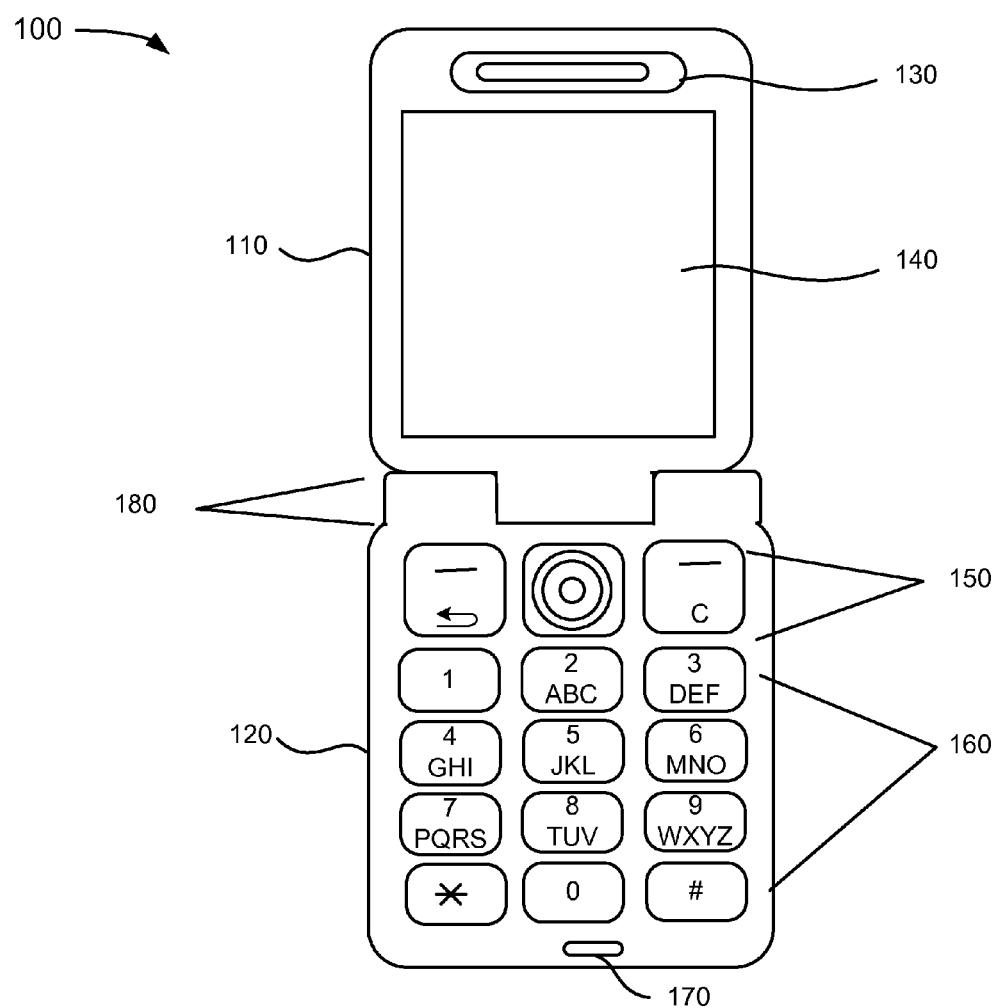
FIG. 1 is a diagram of an exemplary device in which devices, systems and methods described herein may be implemented.

FIG. 1 is a diagram of an exemplary user device 100 which may be used in conjunction with devices, systems and methods described herein. In an exemplary implementation, user device 100 may be a mobile terminal. As used herein, the term "mobile terminal" may include a cellular radiotelephone with or without a multi-line display; a Personal Communications System (PCS) terminal that may combine a cellular radiotelephone with data processing, facsimile and data communications capabilities; a personal digital assistant (PDA) that can include a radiotelephone, pager, Internet/Intranet access, Web browser, organizer, calendar and/or a global positioning system (GPS) receiver; and a conventional laptop and/or palmtop receiver or other appliance that includes a radiotelephone transceiver. Mobile terminals may also be referred to as "pervasive computing" devices.

Referring to FIG. 1, user device 100 may be a flip-type or clamshell device with an upper portion 110 and a lower portion 120. User device 100 is shown in the open position. When in the closed position, upper portion 110 may fold over lower portion 120. Upper portion 110 may include speaker 130 and display 140. Lower portion may include control buttons 150, keypad 160 and microphone 170. Lower portion 110 and upper portion 120 may be connected via a hinge mechanism 180. It should be understood that user device 100 may include other and/or different components. For example, user device 100 may include a camera and a flash mechanism used to take pictures and/or videos, a connector or interface for charging user device 100, etc.

Speaker 130 may provide audible information to a user of user device 100. Display 140 may provide visual information to the user. For example, display 140 may provide information regarding incoming or outgoing telephone calls and/or incoming or outgoing electronic mail (e-mail), instant messages, short message service (SMS) messages, etc. Control buttons 150 may permit the user to interact with user device 100 to cause user device 100 to perform one or more operations, such as place a telephone call, play various media, take a picture, etc.

For example, control buttons 150 may include a dial button, hang up button, play button, a shutter button, etc. Keypad 160 may include a standard telephone keypad. Microphone 170 may receive audible information from the user.

Hinge mechanism 180 may include any type of hinge that couples upper portion 110 and lower portion 120 and allows upper portion 110 to fold over lower portion 120 when user device 100 is not actively being used. In an exemplary implementation, a sensor mechanism may be disposed in hinge mechanism 180 to allow user device 100 to determine whether user device 100 is open or closed, as described in detail below.

Aspects of the invention are described herein in the context of determining whether user device 100 is open or closed. It should also be understood that devices, systems and methods described herein may also be used with other types of devices, such as a personal computer (PC), a laptop computer, a PDA, a media playing device (e.g., an MPEG audio layer 3 (MP3) player, a video game playing device), or other device that may not include various communication functionality for communicating with other devices. It should also be understood that aspects described herein may be used to detect other operating conditions, as described in detail below.

Figure 2:
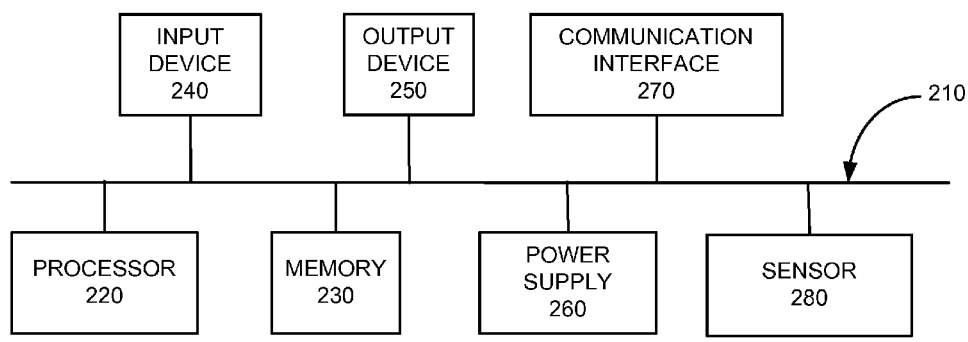
FIG. 2 is a functional block diagram of exemplary components implemented in the device of FIG. 1.

FIG. 2 is a diagram illustrating components of user device 100 according to an exemplary implementation. User device 100 may include bus 210, processor 220, memory 230, input device 240, output device 250, power supply 260, communication interface 270 and sensor 280. Bus 210 permits communication among the components of user device 100. One skilled in the art would recognize that user device 100 may be configured in a number of other ways and may include other or different elements. For example, user device 100 may include one or more modulators, demodulators, encoders, decoders, etc., for processing data.

Processor 220 may include a processor, microprocessor, an application specific integrated circuit (ASIC), field programmable gate array (FPGA) or other processing logic. Processor 220 may execute software instructions/programs or data structures to control operation of user device 100.

Memory 230 may include a random access memory (RAM) or another type of dynamic storage device that stores information and instructions for execution by processor 220; a read only memory (ROM) or another type of static storage device that stores static information and instructions for use by processor 220; a flash memory (e.g., an electrically erasable programmable read only memory (EEPROM)) device for storing information and instructions; and/or some other type of magnetic or optical recording medium and its corresponding drive. Memory 230 may also be used to store temporary variables or other intermediate information during execution of instructions by processor 220. Instructions used by processor 220 may also, or alternatively, be stored in another type of computer-readable medium accessible by processor 220. A computer-readable medium may include one or more memory devices.

Input device 240 may include mechanisms that permit an operator to input information to user device 100, such as microphone 170, keypad 160, control buttons 150, a keyboard (e.g., a QWERTY keyboard, a Dvorak keyboard), a gesture-based device, an optical character recognition (OCR) based device, a joystick, a virtual keyboard, a speech-to-text engine, a mouse, a pen, voice recognition and/or biometric mechanisms, etc.

Output device 250 may include one or more mechanisms that output information to the user, including a display, such as display 140, a printer, one or more speakers, such as speaker 130, etc. Power supply 260, also referred to herein as battery 260, may include one or more batteries or other components used to supply power to components of user device 100.

Communication interface 270 may include one or more transceivers that enable user device 100 to communicate with other devices via wired, wireless or optical mechanisms. For example, communication interface 270 may include one or more radio frequency (RF) transmitters, receivers and/or transceivers and one or more antennas for transmitting and receiving RF data. Communication interface 270 may also include a modem or an Ethernet interface to a local area network (LAN) for communicating via a network.

Sensor 280 may include one or more components to detect whether user device 100 is in an open or closed position. In an exemplary implementation, sensor 280 may include a material that generates a voltage when its configuration has changed. For example, sensor 280 may use an electroactive polymer (EAP) material that generates a voltage when the material is bent, moved or otherwise displaced from its initial condition, as described in more detail below.

User device 100 may provide a platform for a user to make and receive telephone calls, send and receive messages (e.g., electronic mail, text messages, multi-media messages, SMS messages, etc.), play music, play games, take pictures/videos and execute various other applications. User device 100, as described in detail below, may also perform processing associated with detecting various conditions via sensor 280 and performing one or more functions based on the detected condition. In an exemplary implementation, user device 100 may perform all or some of these operations in response to processor 220 executing sequences of instructions contained in a computer-readable medium, such as memory 230. Such instructions may be read into memory 230 from another computer-readable medium via, for example, communication interface 270. A computer-readable medium may include one or more memory devices. In alternative embodiments, hard-wired circuitry may be used in place of or in combination with software instructions to implement processes consistent with the invention. Thus, implementations described herein are not limited to any specific combination of hardware circuitry and software.

Figure 3A:
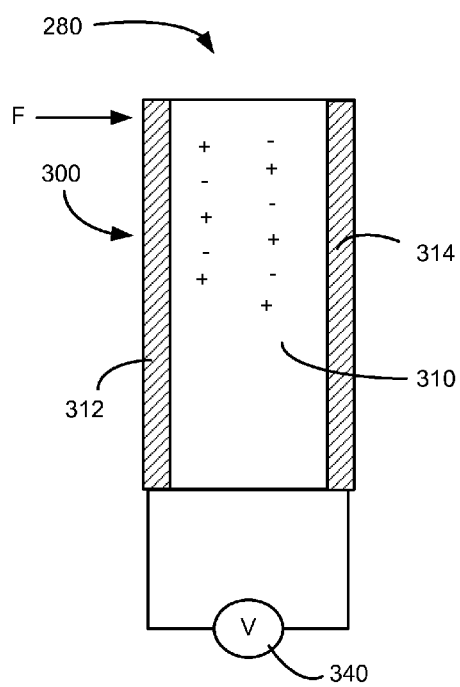
FIGS. 3A and 3B are block diagrams of exemplary components of the sensor of FIG. 2.
Figure 3B:
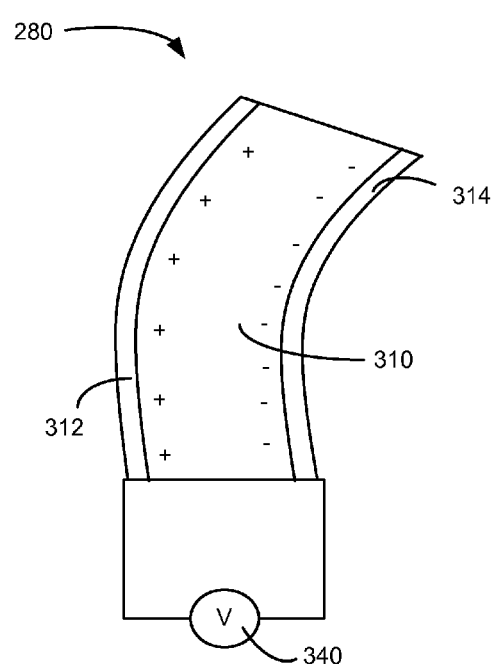

FIGS. 3A and 3B are diagrams illustrating components of sensor 280 according to an exemplary implementation. Referring to FIG. 3A, sensor 280 may include a thin strip of bendable material 300, also referred to herein as flexfilm 300, and a voltage sensor 340. Flexfilm 300 may include a central portion 310 and side portions 312 and 314. In an exemplary implementation, flexfilm 300 may be made from or include an ionic electroactive polymer (EAP), such as Nafion, that is made into a thin, flexible strip. The side portions 312 and 314 of flexfilm 300 (also referred to herein as electrodes 312 and 314) may include electrodes that are coupled to voltage sensor 340. In an exemplary implementation, electrodes 312 and 314 may include carbon electrodes coupled to voltage sensor 340 via electrical conductors. Flexfilm 300 may also be used for other purposes, such as a carrier for electrical wires/conductors that may be used in connection with various components of user device 100. In such implementations, sensor 280 may be integrated into flexfilm 300, which may be used for many purposes, including carrying a number of signaling wires/conductors.

Voltage detector 340 may include any voltage sensing device. In an exemplary implementation, voltage detector 340 may sense voltage generated by movement or displacement of flexfilm 300 from an initial position, as described below.

The configuration illustrated in FIG. 3A is provided for simplicity. In other implementations, sensor 280 may include additional elements, such as electrical circuitry, amplification components, etc., used to signal other components of user device 100 (e.g., processor 220) of a change in condition (e.g., an opening of user device 100, movement of a camera door/cover, etc.), as described in detail below.

In general, an EAP material, such as an ionic EAP material, may change physical dimensions and/or shape when placed in an electric field or when voltage is applied. In an exemplary implementation, flexfilm 300 may also generate a voltage when flexfilm 300 is moved or bent due to ion movement from one side of flexfilm 300 to the other side of flexfilm 300.

For example, as illustrated, in FIG. 3A, in a normal or undisturbed state, ions within central portion 310 (illustrated via the "+" and "−" signs) are relatively evenly distributed within central portion 310. As a result, voltage sensor 340 will register no voltage. However, when a force is applied to flexfilm 300 (as illustrated by F in FIG. 3A), flexfilm 300 may bend, as illustrated in FIG. 3B. As a result of the bending of flexfilm 300, ions within central portion 310 move such that positive charge (represented by the "+" signs) accumulate on one side (e.g., the left portion) and negative charges (represented by the "−" signs) accumulate on the opposite side (e.g., the right side). Voltage detector 340 may detect a voltage resulting from movement of flexfilm 300. The detected voltage may then be used by user device 100 to detect a change in conditions of user device 100, as described in detail below.

In some implementations, a thickness and/or length of flexfilm 300 may be based on the particular device in which flexfilm 300 is used. For example, for user device 100, flexfilm 300 may have a thickness ranging from about 0.1 millimeters (mm) to about 0.2 mm. In addition, the length of flexfilm 300 may vary from less than one millimeter to several centimeters based on the particular usage. Still further, flexfilm 300 is described as being formed of a flexible material made from an EAP. In other implementations, flexfilm 300 may be integrated into other components having other shapes, sizes and may not be flexible, as described in detail below.

Figure 4A:
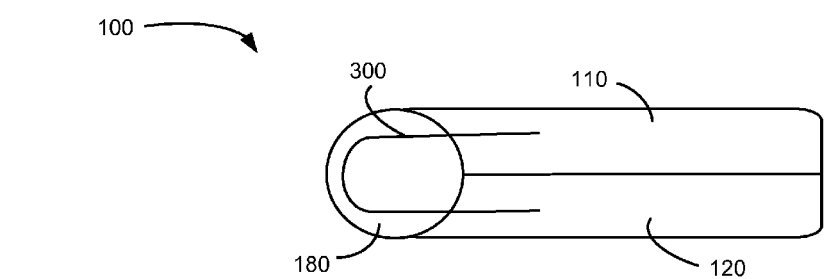
FIGS. 4A and 4B are side views of the user device of FIG. 1 illustrating some of the components of the sensor of FIGS. 3A and 3B.
Figure 4B:
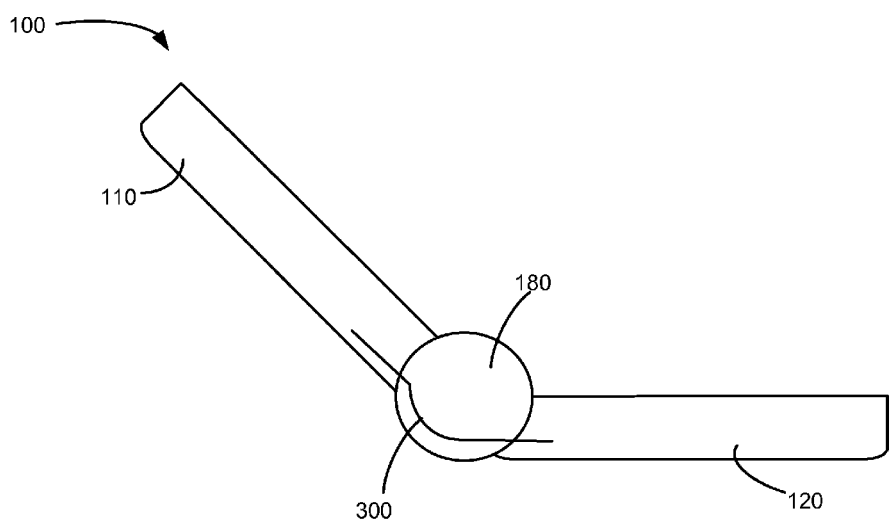

FIG. 4A is a side view of user device 100 in the closed position and FIG. 4B is a side view of user device 100 in the open position. Referring to FIG. 4A, user device 100 is a flip-type or clamshell form factor that includes upper portion 110 closed over lower portion 120, which are interconnected via hinge 180. The closed position may correspond to the user carrying user device 100 in his/her pocket and not engaging in a conversation or otherwise interacting with user device 100. As illustrated, flexfilm 300 is shown in an initial, undisturbed position. In the initial position, flexfilm 300 is configured as a single strip of flexible EAP material that traverses a portion of upper portion 110, hinge 180 and a portion of lower portion 120. Voltage detector 340 is not shown in FIG. 4A for simplicity. In this initial position, ions within flexfilm 300 may be distributed in a manner similar to that illustrated in FIG. 3A such that no voltage is generated by flexfilm 300.

When the user wishes to interact with user device 100 (e.g., place a telephone call, send a message, play a song, etc.), the user may open user device 100 to the position illustrated in FIG. 4B. In this position, flexfilm 300 has been disturbed or moved from its initial position. As a result, positive charges may accumulate on one side of flexfilm 300 and negative charges may accumulate on the opposite side in a manner similar to that illustrated in FIG. 3B. Voltage detector 340 may detect this voltage and signal user device 100 that the user device 100 is now in an open state. User device 100 may use this information to perform a particular function, as described in detail below.

Figure 5:
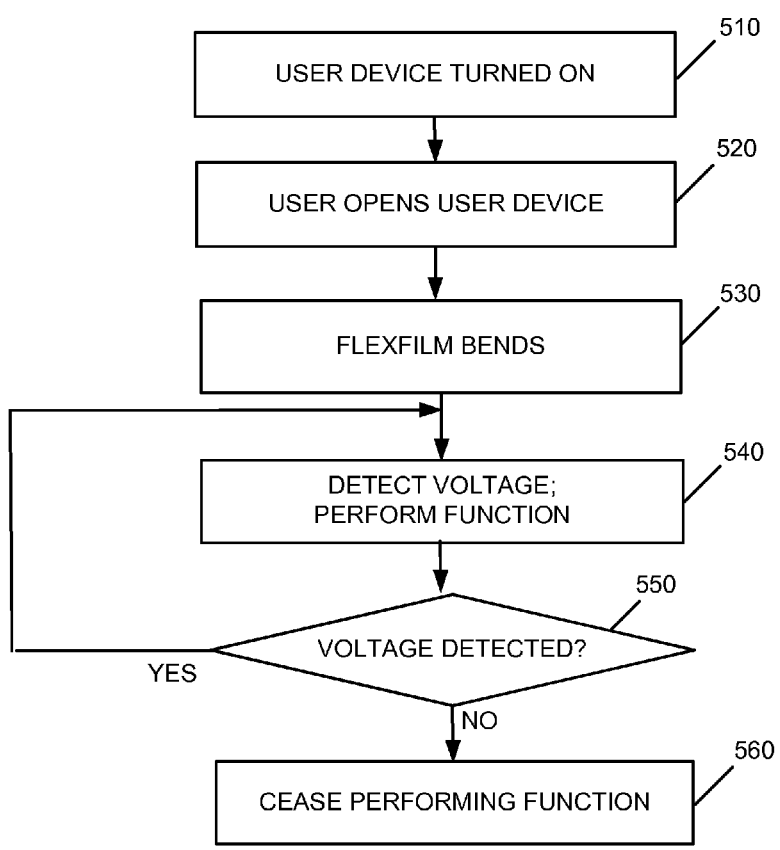
FIG. 5 illustrates exemplary processing associated with operation of the sensor of FIGS. 3A and 3B consistent with implementations described herein.

FIG. 5 is a flow diagram illustrating exemplary processing associated with interacting with user device 100. Processing may begin with user device 100 being powered up and turned on (act 510). In this example, assume that user device 100 is in the closed position illustrated in FIG. 4A. Further assume that the user opens user device 100 such that user device 100 is in the position illustrated in FIG. 4B (act 520). For example, the user may open user device 100 to access the Internet, place a telephone call, take a picture, etc.

In the open state, flexfilm 300 may bend from its initial state, as illustrated in FIG. 4B (act 530). Sensor 340 may detect a voltage caused by the bending of flexfilm 300 (act 540). For example, as discussed above with respect to FIG. 4B, positive charges may accumulate on one side of flexfilm 300 and negative charges may accumulate on the opposite side of flexfilm 300 due to the bending of flexfilm 300 from its initial state. Voltage detector 340 may detect the potential/voltage difference (e.g., a positive voltage) between electrodes 312 and 314 caused by the ion movement.

Voltage detector 340 may forward this voltage or an indication of the voltage to processor 220 (FIG. 2). Processor 220 may then perform a function based on the detected voltage associated with the opening of user device 100 (act 540). For example, processor 220 may signal output device 250 to turn on a backlight to light display 140 to allow the user to more easily interact with display 140. Alternatively, or additionally, processor 220 may signal output device 250 to activate control buttons 150 and/or keypad 160 so that control buttons 150 and/or keypad 160 may accept inputs.

Sensor 280 may continue to determine whether voltage (e.g., a positive voltage) is detected (act 550). For example, if voltage detector 340 continues to detect the voltage (act 550-yes), this indicates that user device 100 is still in the open position. Continuing with the example above, processor 220 may signal output device 250 to maintain the backlight in the "on" state.

If, however, voltage detector 340 detects a negative voltage or no longer detects voltage generated by flexfilm 300 (act 550—no), voltage detector 340 may signal processor 220 that voltage is no longer detected. When voltage detector 340 detects a negative voltage or no longer detects voltage, this may indicate that user device 100 is in the closed position illustrated in FIG. 4A. As discussed above with respect to FIG. 4B, in the closed position, flexfilm 300 returns to its initial state, the ions move back to the state illustrated in FIG. 3A and no voltage may be generated. In other implementations, when flexfilm 300 returns to its initial state, a negative voltage may be generated. In either case, processor 220 may then cease performing the particular function associated with the opened user device 100 since user device 100 is in the closed position (act 560). For example, continuing with the example above, processor 220 may signal output device 250 to de-activate the backlight associated with display 140. Additionally, processor 220 may signal output device 250 to de-activate control buttons 150 and/or keypad 160.

In this manner, sensor 280 may monitor movement of flexfilm 300 within user device 100 and user device 100 may perform an appropriate action based on the detected voltage. In this example, sensor 280 may use a very thin flexfilm 300 (e.g., less than 1 mm in thickness) as opposed to a conventional magnetic switch and/or hall sensor used in many devices to detect opening/closing of user device 100. This may help save significant space within user device 100. In addition, not including a magnet within an open/close sensor may eliminate interference problems associated with other components that may be included in user device 100, such as a magnetometer used in a compass application that may be included in user device 100.

Implementations described above refer to detecting an open/closed state of user device 100. In other implementations, flexfilm 300 may be integrated into other components or functionality within user device 100. For example, flexfilm 300 may be used in a keypad membrane or a single button to detect or register an input. In such an implementation, deflection or movement of flexfilm 300 may be caused by pressure exerted by a user's finger or stylus on keypad 160 or a single one of control buttons 150. Such movement may result in flexfilm 300 generating a voltage and processor 220 registering a particular input.

Flexfilm 300 may also be integrated within a camera functionality. For example, flexfilm 300 may be used to indicate that a protective camera covering or door has been opened by the user. In this case, sensor 280 may forward a voltage or an indication of voltage detection to processor 220. Processor 220 may then activate or enable various camera functionality (e.g., a flash, a zoom, an auto-focus, etc.) on user device 100. When the user closes the camera covering/door, voltage detector 340 may no longer detect a voltage and processor 220 may de-activate the camera functionality.

As described above, movement of flexfilm 300 in one direction (e.g., the direction illustrated in FIG. 4A) may generate a positive voltage. Movement of flexfilm 300 in the opposite direction may generate a negative voltage. In some implementations, the direction of movement and corresponding positive or negative voltage may be used to provide different functionality.

In addition, in some implementations, the amount of movement may be proportional or linear with respect to the generated voltage. For example, opening user device 100 to a halfway position (e.g., to a point where a user can access control buttons 150 and/or keypad 160 may generate a first voltage, while opening user device 100 to a fully open position (e.g., to a point where a user can easily view display 140) may generate a second voltage that is greater than the first voltage. In this situation, processor 220 may receive the first voltage and perform a first function and when processor receives the second voltage, perform a second function. As an example, when processor 220 receives the first voltage, processor 220 may signal output device 250 to power the backlight to a first level that is not the fully powered level. When processor 220 receives the second voltage, processor 220 may signal output device 250 to power the backlight to the fully activated level. Additional intermediate voltages between the first and second voltages may also be generated to allow processor 220 to ramp up the powering of the backlight based on the degree to which user device 100 is opened. In this manner, sensor 280 may provide several levels of activation/functionality based on the generated voltages, as compared to conventional on/off detection.

As another example, a user may press a keypad input or button associated with camera functionality that includes flexfilm 300. A first, relatively light press of the input/button may move flexfilm 300 to generate a first voltage that results in activation of an auto-focus function. A second, harder press of the input/button may further depress or move flexfilm 300 and generate a second, greater voltage that results in activation of the shutter to take a picture.

CONCLUSION

Implementations described herein provide for use of a sensor that includes material that generates a voltage based on movement of the material. This may allow user devices to incorporate sensors without adversely impacting other functionality. In addition, the sensor may allow for multiple levels of activation, as compared to conventional binary sensors.

The foregoing description of the embodiments of the invention provides illustration and description, but is not intended to be exhaustive or to limit the invention to the precise form disclosed. Modifications and variations are possible in light of the above teachings or may be acquired from practice of the invention.

For example, aspects have been described with respect to integrating EAP material into a flexible film. In other implementations, sensor 280 may not include a flexible material. For example, the EAP material may be integrated into a door (e.g., a camera door or protective cover), a sliding mechanism (e.g., a mechanism for opening a slider type phone or a mechanism for accessing a keyboard) or other components which do not require bending or similar flexibility.

Further, aspects described above refer to voltage detector 340 outputting a voltage or voltage indication to processor 220. In some implementations, intermediate amplification circuitry may be used to amplify the detected voltage signal, which may be relatively low in magnitude (e.g., in the millivolt range) prior to processing by processor 220 or other devices in user device 100.

In addition, aspects have been described above with respect to using EAP material that generates a voltage in response to movement of the EAP material. In other implementations, other materials that generate a voltage in response to movement may be used in sensor 280.

Further, while series of acts have been described with respect to FIG. 5, the order of the acts may be varied in other implementations consistent with the invention. Moreover, non-dependent acts may be performed in parallel.

It will also be apparent to one of ordinary skill in the art that aspects of the invention, as described above, may be implemented in, for example, charging cables, computer devices, cellular communication devices/systems, media playing devices, methods, and/or computer program products. Accordingly, aspects of the present invention may be embodied in hardware and/or in software (including firmware, resident software, micro-code, etc.). Furthermore, aspects of the invention may take the form of a computer program product on a computer-usable or computer-readable storage medium having computer-usable or computer-readable program code embodied in the medium for use by or in connection with an instruction execution system. The actual software code or specialized control hardware used to implement aspects consistent with the principles of the invention is not limiting of the invention. Thus, the operation and behavior of the aspects were described without reference to the specific software code—it being understood that one of ordinary skill in the art would be able to design software and control hardware to implement the aspects based on the description herein.

Further, certain portions of the invention may be implemented as "logic" that performs one or more functions. This logic may include hardware, such as a processor, a microprocessor, an ASIC, or an FPGA, software, or a combination of hardware and software.

It should be emphasized that the term "comprises/comprising" when used in this specification is taken to specify the presence of stated features, integers, steps, or components, but does not preclude the presence or addition of one or more other features, integers, steps, components, or groups thereof.

No element, act, or instruction used in the description of the present application should be construed as critical or essential to the invention unless explicitly described as such. Also, as used herein, the article "a" is intended to include one or more items. Further, the phrase "based on," as used herein is intended to mean "based, at least in part, on" unless explicitly stated otherwise.

The scope of the invention is defined by the claims and their equivalents.

What is claimed is:

1. A device, comprising:
a component including an electroactive polymer (EAP) material configured to generate a voltage in response to movement of the component;
a voltage detector coupled to the component, the voltage detector configured to detect voltage generated by the component;
processing logic configured to perform a function based on the detected voltage;
a hinge coupling an upper portion of the device to a lower portion of the device, wherein at least a portion of the component is disposed in the hinge,
wherein the component comprises a flexible strip that is configured to bend or un-bend when the device is opened, and
wherein the processing logic is further configured to:
determine that the device is open based on the detected voltage.

2. The device of claim 1, wherein the EAP material comprises an ionic EAP material.

3. The device of claim 1, wherein the voltage detector is configured to:
forward information corresponding to the detected voltage to the processing logic.

4. The device of claim 1, wherein when performing a function, the processing logic is configured to at least one of activate a backlight, activate a keypad, activate a button, activate camera functionality or register an input.

5. The device of claim 1, wherein when generating a voltage, the component is configured to:
generate a voltage based on an amount of movement, wherein a larger amount of movement generates a greater voltage as compared to a smaller amount of movement.

6. The device of claim 5, wherein the component is configured to:
generate a first voltage in response to a first movement, and
generate a second voltage in response to a second movement, and wherein the processing logic is further configured to:
receive information corresponding to the first and second voltages,
perform a first function in response to the first voltage, and
perform a second function in response to the second voltage.

7. The device of claim 1, wherein the processing logic is further configured to determine a state of the device based on the generated voltage and wherein the EAP material comprises Nafion.

8. The device of claim 1, wherein the device comprises a mobile terminal.

9. A method, comprising:
generating, in a device, a voltage in response to movement of a flexible component comprising an electroactive polymer (EAP) material;
detecting the generated voltage; and
performing, by the device, a function based on the detected voltage, wherein the device comprises a mobile terminal, the method further comprising:
determining whether the device is open based on the detected voltage, and
wherein the performing a function comprises at least one of activating a backlight or a keypad in response to determining that the device is open.

10. The method of claim 9, wherein the performing a function further comprises at least one of activating a button, activating camera functionality or registering an input.

11. The method of claim 9, wherein the generating a voltage comprises:
generating a voltage based on an amount of movement of the flexible component, wherein a larger amount of movement generates a greater voltage as compared to a smaller amount of movement.

12. The method of claim 11, wherein generating a voltage further comprises:
generating a first voltage in response to a first movement of the flexible component, and
generating a second voltage in response to a second movement of the flexible component, the method further comprising:
performing a first function in response to the first voltage, and
performing a second function in response to the second voltage.

13. A device, comprising:
an electroactive polymer (EAP) material configured to generate a voltage in response to movement of the EAP material;
a voltage detector coupled to the EAP material via electrodes, the voltage detector configured to detect voltage generated by the EAP material;
a processor configured to perform a function based on the detected voltage; and
at least one of a hinge coupling an upper portion of the device to a lower portion of the device or a camera cover protecting a camera component of the device, wherein at least a portion of the EAP material is disposed in the hinge or the camera cover, and
wherein the processor is further configured to:
determine whether the device is open or the camera cover is open based on the detected voltage.

14. The device of claim 13, further comprising:
the hinge,
wherein the processor is further configured to:
determine whether the device is open based on the detected voltage.

15. The device of claim 14, wherein when generating a voltage, the component is configured to:
generate a voltage based on an amount of movement of the EAP material, and wherein the processor is configured to increase the powering of a backlight for the device as the voltage generated by the movement of the EAP material increases.

16. The device of claim 13, wherein when performing a function, the processor is configured to at least one of activate a backlight, activate a keypad, activate a button, activate camera functionality or register an input.

17. The device of claim 13, wherein the EAP material is configured to:
generate a first voltage in response to a first movement of the EAP material, and
generate a second voltage in response to a second movement of the EAP material, and wherein the processor is further configured to:
receive information corresponding to the first and second voltages,
perform a first function in response to the first voltage, and
perform a second function in response to the second voltage.

18. The device of claim 13, wherein the device comprises a mobile device.

19. The device of claim 13, further comprising:
the camera cover, wherein when performing a function, the processor is configured to activate camera functionality in response to determining that the camera cover is open.

* * * * *